(12) United States Patent
Lee et al.

(10) Patent No.: US 11,206,750 B2
(45) Date of Patent: Dec. 21, 2021

(54) DISPLAY APPARATUS

(71) Applicant: SAMSUNG ELECTRONICS CO., LTD., Suwon-si (KR)

(72) Inventors: Sung Su Lee, Seoul (KR); Sung Ki Kim, Seoul (KR); Myeong Gil Kim, Suwon-si (KR); Hyun Jun Jung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/769,072

(22) PCT Filed: Sep. 13, 2018

(86) PCT No.: PCT/KR2018/010790
§ 371 (c)(1),
(2) Date: Jun. 2, 2020

(87) PCT Pub. No.: WO2019/124682
PCT Pub. Date: Jun. 27, 2019

(65) Prior Publication Data
US 2021/0176902 A1 Jun. 10, 2021

(30) Foreign Application Priority Data
Dec. 22, 2017 (KR) .................. 10-2017-0178462

(51) Int. Cl.
*H05K 7/20* (2006.01)
*G06F 1/20* (2006.01)
*G02F 1/1333* (2006.01)

(52) U.S. Cl.
CPC ... *H05K 7/20972* (2013.01); *G02F 1/133385* (2013.01); *G06F 1/20* (2013.01)

(58) Field of Classification Search
CPC .............................. H05K 7/20972; G06F 1/20
See application file for complete search history.

(56) References Cited

U.S. PATENT DOCUMENTS 8,254,121 B2 * 8/2012 Lee ..................... F04D 29/441
361/695
9,456,525 B2 9/2016 Yoon et al.
(Continued)

FOREIGN PATENT DOCUMENTS

JP         8-305301 A    11/1996
JP      2010-262256 A    11/2010
(Continued)

OTHER PUBLICATIONS

International Search Report dated Jan. 15, 2019 issued by the International Searching Authority in counterpart International Application No. PCT/KR2018/010790 (PCT/ISA/210).
(Continued)

*Primary Examiner* — Stephen S Sul
(74) *Attorney, Agent, or Firm* — Sughrue Mion, PLLC

(57) ABSTRACT

An outdoor display apparatus having a heat dissipation structure includes a first display module configured to display an image in a first direction, a second display module configured to display an image in a second direction opposite to the first direction, a housing configured to accommodate the first display module and the second display module, and having an inlet and an outlet, and a heat exchange device configured to receive heat from one of the first display module and the second display module and perform heat exchange, wherein the heat exchange device includes: a first heat exchange portion having at least one cooling passage to cool the first display module; a second heat exchange portion having at least one cooling passage to cool the second display module; and a heat exchanger configured to be selectively shared by the first heat exchange portion and the second heat exchange portion.

10 Claims, 12 Drawing Sheets

(56) References Cited

U.S. PATENT DOCUMENTS

| | | | | |
|---|---|---|---|---|
| 10,080,316 B2* | 9/2018 | Dunn | | G02F 1/133615 |
| 10,194,564 B2* | 1/2019 | Dunn | | G02F 1/133385 |
| 10,420,257 B2* | 9/2019 | Dunn | | H05K 7/20154 |
| 10,485,147 B2* | 11/2019 | Oh | | H05K 7/20136 |
| 10,485,148 B2* | 11/2019 | Oh | | H05K 5/0213 |
| 2010/0142149 A1* | 6/2010 | Nakamichi | | H05K 7/2099 |
| | | | | 361/701 |
| 2010/0226091 A1 | 9/2010 | Dunn | | |
| 2010/0238394 A1* | 9/2010 | Dunn | | H05K 7/20145 |
| | | | | 349/161 |
| 2011/0013114 A1* | 1/2011 | Dunn | | H05K 7/20136 |
| | | | | 349/61 |
| 2011/0085301 A1 | 4/2011 | Dunn | | |
| 2014/0334100 A1* | 11/2014 | Yoon | | G09F 9/33 |
| | | | | 361/692 |
| 2015/0009627 A1* | 1/2015 | Dunn | | H05K 7/20972 |
| | | | | 361/697 |
| 2016/0041423 A1 | 2/2016 | Dunn | | |
| 2016/0198588 A1* | 7/2016 | DeMars | | G09F 9/33 |
| | | | | 362/97.1 |
| 2016/0198589 A1* | 7/2016 | Kang | | H05K 7/20154 |
| | | | | 361/692 |
| 2017/0111520 A1* | 4/2017 | Bowers | | H04M 17/02 |

FOREIGN PATENT DOCUMENTS

| | | |
|---|---|---|
| JP | 2011-253057 A | 12/2011 |
| JP | 2017-138372 A | 8/2017 |
| KR | 10-2010-0008614 A | 1/2010 |

OTHER PUBLICATIONS

Communication dated Oct. 14, 2020 issued by the European Intellectual Property Office in counterpart European Application No. 18890146.6.

Communication dated Jul. 26, 2021, issued by the European Patent Office in European Application No. 18890146.6.

Communication dated Jul. 6, 2021, issued by the Japanese Patent Office in Japanese Application No. 2020-533830.

Communication dated Oct. 19, 2021, issued by the Japanese Patent Office in Japanese Application No. 2020-533830.

* cited by examiner

US 11,206,750 B2

DISPLAY APPARATUS

CROSS-REFERENCE TO RELATED APPLICATIONS

This application is a National Stage of International Application No. PCT/KR2018/010790 filed Sep. 13, 2018, claiming priority based on Korean Patent Application No. 10-2017-0178462 filed Dec. 22, 2017.

TECHNICAL FIELD

The disclosure relates to a display apparatus, and more specifically, to an outdoor display apparatus having a heat dissipation structure.

BACKGROUND ART

In general, a display apparatus refers to an apparatus that displays an image on a screen, such as a television, a computer monitor, and a digital information display. In recent years, such display apparatuses are often installed outdoors or in open-air areas for advertisement. Such an outdoor display apparatus may include a billboard placed outside a building and displaying images.

As described above, when the outdoor display apparatus has a display panel directly exposed to sunlight, the outdoor display apparatus may deteriorate with the surface temperature increasing.

In addition, the display apparatus may include a display panel and a backlight unit that causes light to enter a rear surface of the display panel. The display panel may be formed of a pair of substrates facing each other with a liquid crystal layer interposed therebetween. The backlight unit may be provided with a light source that introduces light to the display panel. The light source of the backlight unit not only generates light but also emits heat together, which may lead to deterioration of the display panel.

Accordingly, the display apparatus may have a heat dissipation structure for preventing the display panel from deteriorating. The heat dissipation structure may be implemented by a structure including a fan and an air filter.

Since the above described heat dissipation structure occupies a large volume, and thus is not easily applicable to a display apparatus having a slim design. Specifically, in the case of a heat dissipation structure including a fan and an air filter, since the filter needs to be periodically replaced, a great maintenance cost is required.

DISCLOSURE

Technical Problem

Therefore, it is an object of the disclosure to provide a double-sided outdoor display apparatus capable of improving the cooling efficiency to prevent deterioration of a display panel in the display apparatus.

It is another object of the disclosure to provide a display apparatus allowing the volume of a heat dissipation apparatus to be minimized, so that product slimization may be achieved.

It is another object of the disclosure to provide a double-sided outdoor display apparatus capable of sharing a heat exchange area within a heat exchange device of the double-sided outdoor display apparatus, so that when sunlight is incident onto one side, heat is dissipated through the other side having a relatively low temperature.

Additional aspects of the disclosure will be set forth in part in the description which follows and, in part, will be obvious from the description, or may be learned by practice of the disclosure.

According to an aspect of the present disclosure, there is provided a display apparatus including: a first display module configured to display an image in a first direction; a second display module configured to display an image in a second direction opposite to the first direction; a housing configured to accommodate the first display module and the second display module, and having an inlet and an outlet; and a heat exchange device configured to receive heat from one of the first display module and the second display module and perform heat exchange, wherein the heat exchange device includes: a first heat exchange portion having at least one cooling passage to cool the first display module; a second heat exchange portion having at least one cooling passage to cool the second display module; and a heat exchanger configured to be selectively shared by the first heat exchange portion and the second heat exchange portion.

The first heat exchange portion may include: a first cooling passage allowing air to be circulated to the first display module; and a second cooling passage allowing outside air introduced through the inlet to cool the first display module and then to be discharged through the outlet.

The second heat exchange portion may include: a third cooling passage allowing air to be circulated to the second display module; and a fourth cooling passage allowing outside air introduced through the inlet to cool the second display module and then to be discharged through the outlet.

The heat exchanger may include: a plurality of first channels that are configured to be shared by the first cooling passage and the third cooling passage and a plurality of second channels that are configured to be shared by the second cooling passage and the fourth cooling passage.

The first heat exchange portion may include: a first blower device provided to cause air of the second cooling passage to move, and suction outside air; a first case configured to accommodate the first blower device and having a first inlet hole; a second blower device provided to cause air in the first cooling passage to move; and a second case configured to accommodate the second blower device.

The second heat exchange portion may include: a third blower device provided to cause air of the fourth cooling passage to move, and suction outside air; a third case configured to accommodate the third blower device and having a second inlet hole; a fourth blower device provided to cause air in the third cooling passage to move; and a fourth case configured to accommodate the fourth blower device.

The display apparatus may further include a fifth case configured to accommodate the heat exchanger, wherein the fifth case may include an outlet hole through which air moving along the second cooling passage and the fourth cooling passage may be discharged.

The fifth case may include: a first connection hole configured to communicate the first cooling passage with the heat exchange such that the air of the first cooling passage is heat exchanged through the plurality of first channels; and a second connection hole configured to communicate the third cooling passage with the heat exchange such that the air of the third cooling passage is heat exchanged through the plurality of first channels.

The second case may include a first opening configured to communicate the first cooling passage with the heat exchanger such that the air of the first cooling passage is introduced into the plurality of first channels by the second blower device, and the fourth case includes a second opening configured to communicate the third cooling passage with the heat exchanger such that the air of the third cooling passage is introduced into the plurality of first channels by the fourth blower device.

The heat exchange device may include a controller, and the controller may perform control to cause a rotating speed of at least one of the first blower device or the second blower device to increase when the first display module has a temperature higher than a temperature of the second display module, and perform control to cause a rotating speed of at least one of the third blower device or the fourth blower device to increase when the first display module has a temperature lower than a temperature of the second display module.

The heat exchanger device may include at least one temperature sensor, and the at least one temperature sensor may be disposed on at least one of the first display module or the second display module.

The plurality of first channels and the plurality of second channels may be disposed in an alternate manner.

The first case and the third case may be disposed at an upper side of the fifth case, and the second case and the fourth case may be disposed at a lower side of the fifth case.

According to another aspect of the present disclosure, there is provided a display apparatus including: a first display module on which an image is displayed in a first direction; a second display module on which an image is displayed in a second direction opposite to the first direction; a housing configured to accommodate the first display module and the second display module, and having an inlet hole and an outlet hole; a first cooling passage allowing air to be circulated to the first display module; a second cooling passage allowing outside air introduced through the inlet hole to cool the first display module and then to be discharged through the outlet hole; a third cooling passage allowing air to be circulated to the second display module; a fourth cooling passage allowing outside air introduced through the inlet hole to cool the second display module and then to be discharged through the outlet hole; and a heat exchanger disposed in the housing to cause air flowing through the second cooling passage and the fourth cooling passage to heat-exchange with air flowing through the first cooling passage and the third cooling passage, and allowing outside air to be supplied to and discharged from the second cooling passage and the fourth cooling passage.

The heat exchanger may include a plurality of first channels that are configured to be shared by the first cooling passage and the third cooling passage, and a plurality of second channels that may be configured to be shared by the second cooling passage and the fourth cooling passage.

The plurality of first channels and the plurality of second channels may be disposed in an alternate manner.

The heat exchange device may include a controller, and the controller performs control to cause a rotating speed of a first blower device and a second blower device to be increased when the first display module has a temperature higher than a temperature of the second display module, and perform control to cause a rotating speed of a third blower device and a fourth blower device to be increased when the first display module has a temperature lower than a temperature of the second display module.

The heat exchanger device may include at least one temperature sensor, and the at least one temperature sensor may be disposed on at least one of the first display module or the second display module.

The display apparatus may further include: a first blower device provided to cause air of the second cooling passage to move, and suction outside air; a first case configured to accommodate the first blower device and having a first inlet hole; a second blower device provided to cause air in the first cooling passage to move; a second case configured to accommodate the second blower device; a third blower device provided to cause air of the fourth cooling passage to move, and suction outside air; a third case configured to accommodate the third blower device and having a second inlet hole; a fourth blower device provided to cause air in the third cooling passage to move; and a fourth case configured to accommodate the fourth blower device.

The display apparatus may further include a fifth case configured to accommodate the heat exchanger, wherein the fifth case may include an outlet hole through which air moving along the second cooling passage and the fourth cooling passage may be discharged.

Advantageous Effects

According to an embodiment of the present disclosure, the cooling efficiency of the double-sided outdoor display apparatus is improved, so that the display panel can be prevented from deteriorating.

In addition, since the volume of the heat dissipation device is minimized, the product slimization can be achieved.

In addition, in a double-sided outdoor display apparatus, a heat exchange area is shared within a heat exchange device, so that when sunlight is incident onto one side, heat can be dissipated through the other side having a relatively lower temperature.

In addition, since the rotational speed of a blower device in a heat exchange device is adjusted, a heat exchange area of a double-sided outdoor display apparatus having one side restricted on heat dissipation of the display may be selectively increased or decreased. Accordingly, the temperature of the display at a side having a relatively high temperature can be more rapidly cooled.

MODES OF THE DISCLOSURE

Figure 1:
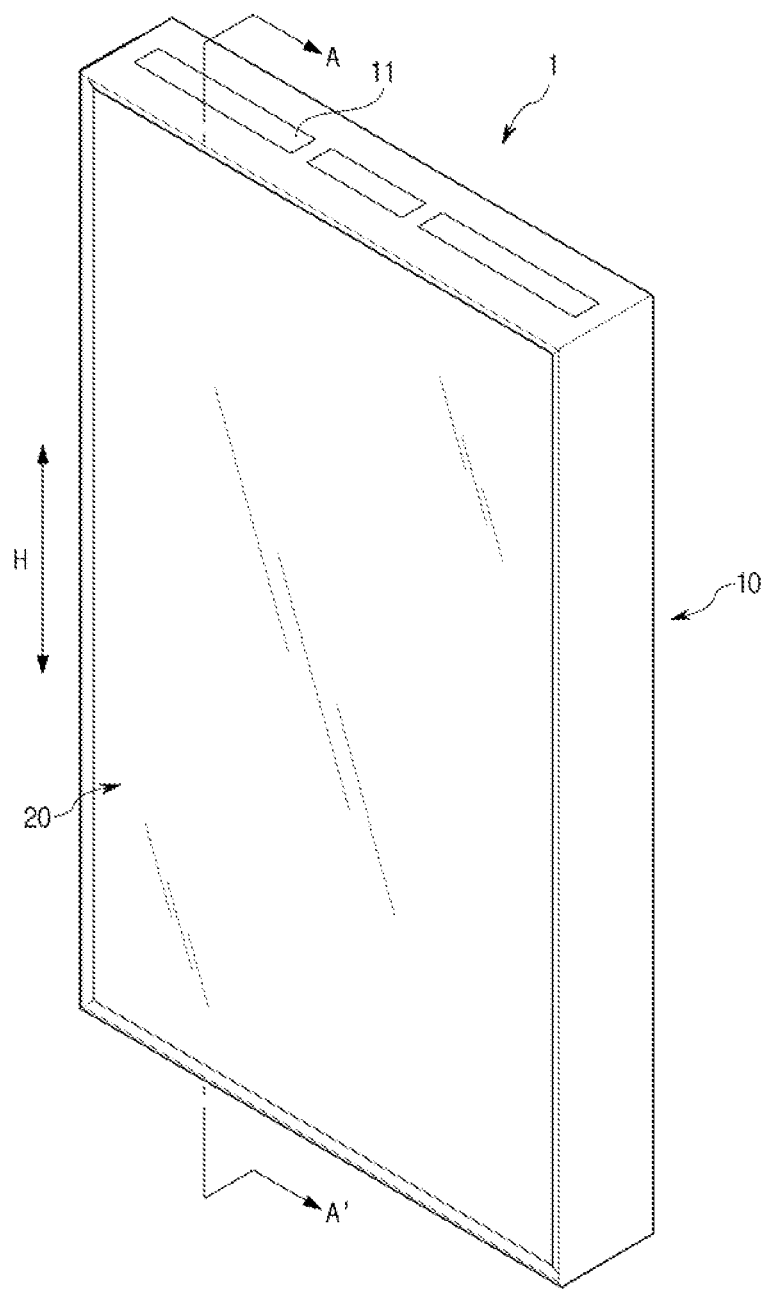
FIG. 1 is a perspective view illustrating a display apparatus according to an embodiment of the disclosure.

The embodiments set forth herein and illustrated in the configuration of the present disclosure are only the most preferred embodiments and are not representative of the full the technical spirit of the present disclosure, so it should be understood that they may be replaced with various equivalents and modifications at the time of the disclosure.

Throughout the drawings, like reference numerals refer to like parts or components.

The terminology used herein is for the purpose of describing particular embodiments only and is not intended to limit the disclosure. It is to be understood that the singular forms "a," "an," and "the" include plural references unless the context clearly dictates otherwise. It will be further understood that the terms "include", "comprise" and/or "have" when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another. Thus, a first element, component, region, layer or section discussed below could be termed a second element, component, region, layer or section without departing from the teachings of the disclosure. Descriptions shall be understood as to include any and all combinations of one or more of the associated listed items when the items are described by using the conjunctive term "~ and/or ~," or the like.

Hereinafter, embodiments according to the disclosure will be described in detail with reference to the accompanying drawings.

Figure 2:
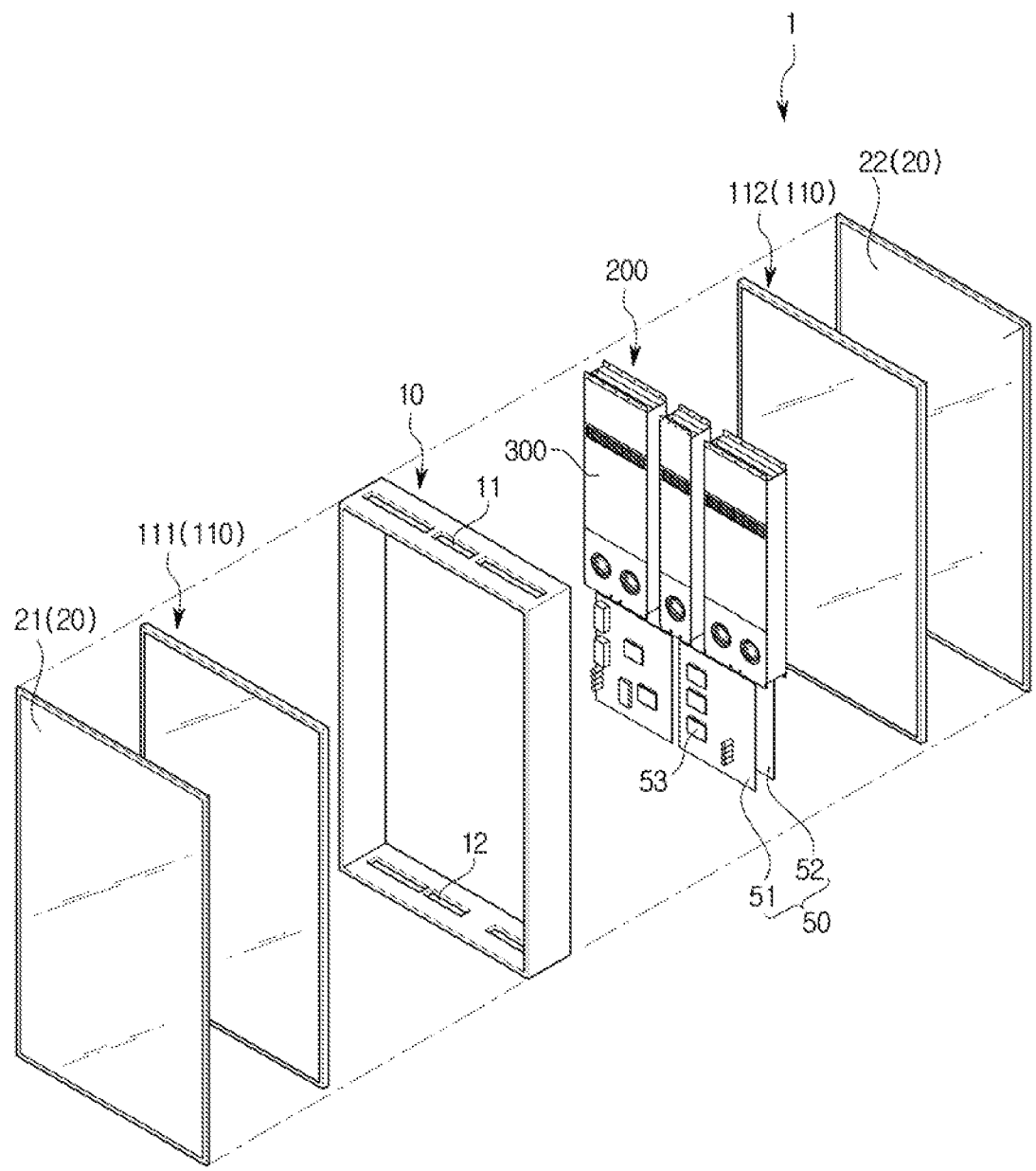
FIG. 2 is an exploded perspective view illustrating a display apparatus according to an embodiment of the disclosure.
Figure 3:
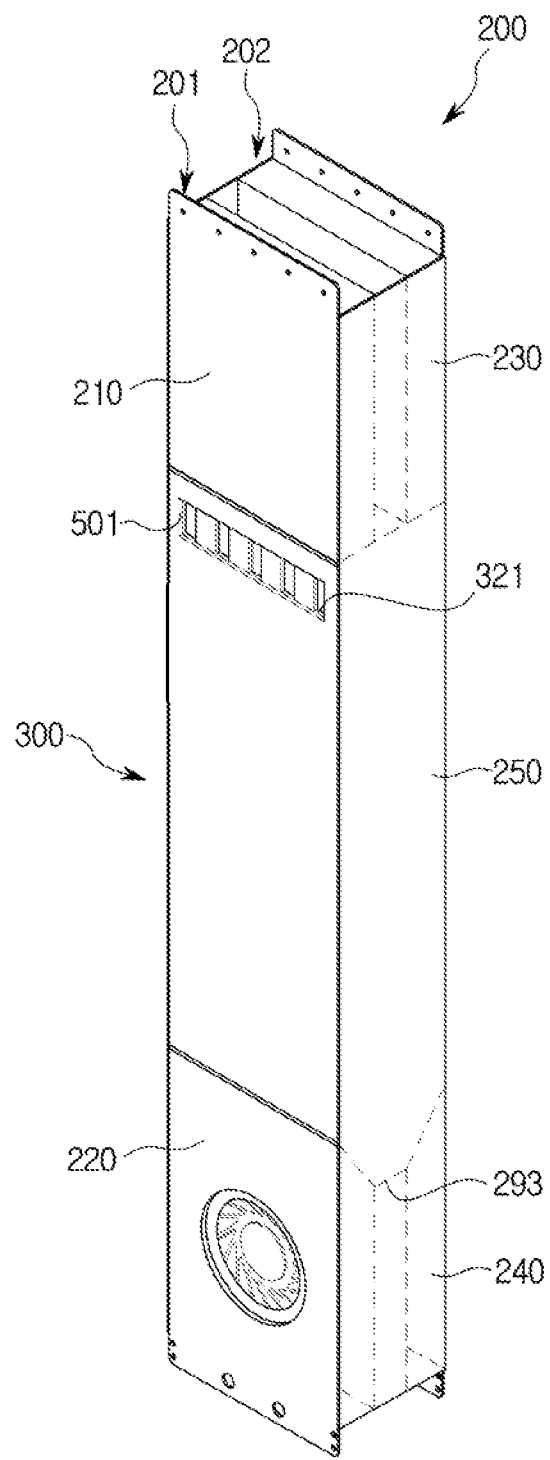
FIG. 3 is a perspective view illustrating a heat exchange device according to an embodiment of the disclosure.
Figure 4:
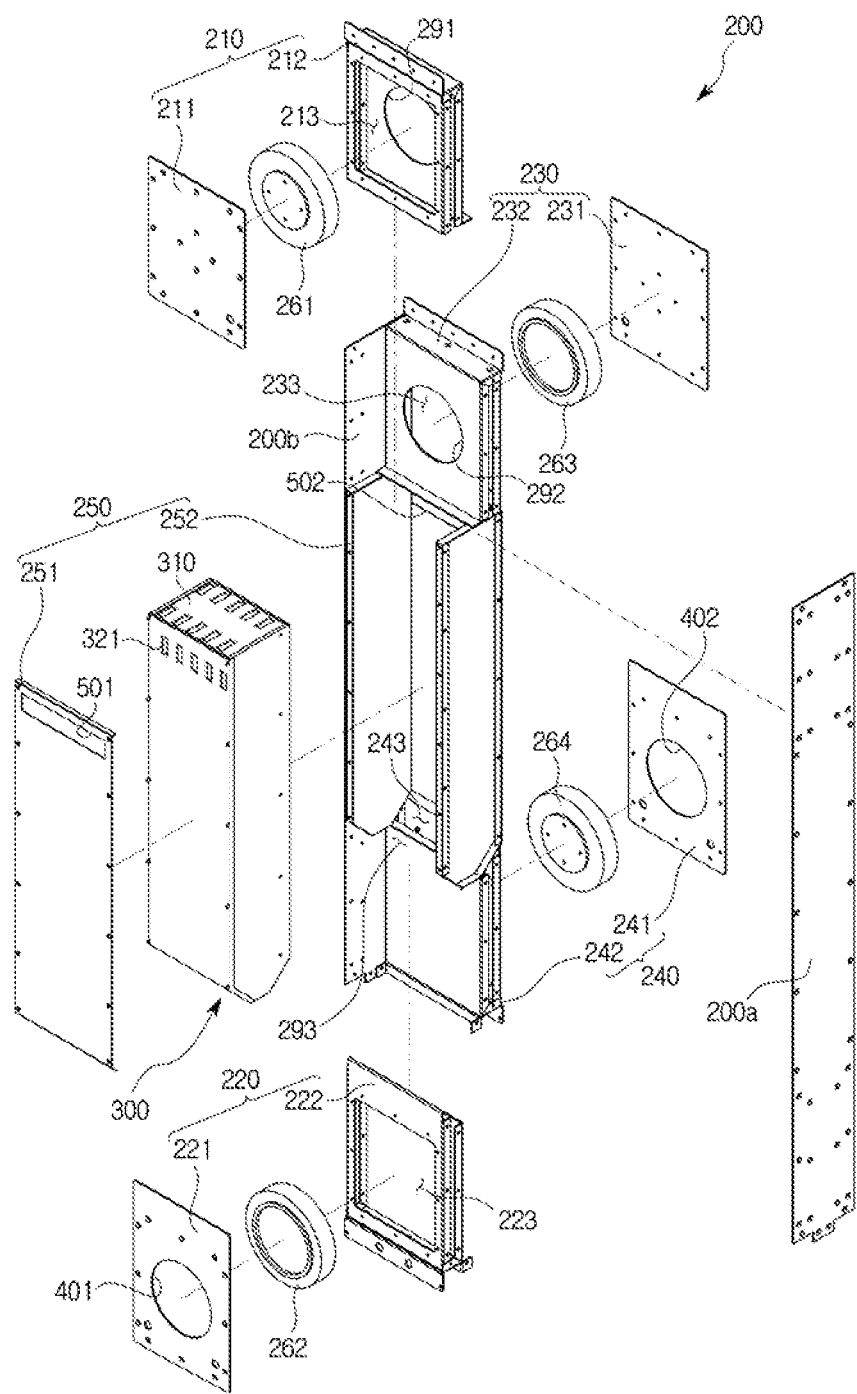
FIG. 4 is an exploded perspective view illustrating a heat exchange device according to an embodiment of the disclosure.
Figure 5:
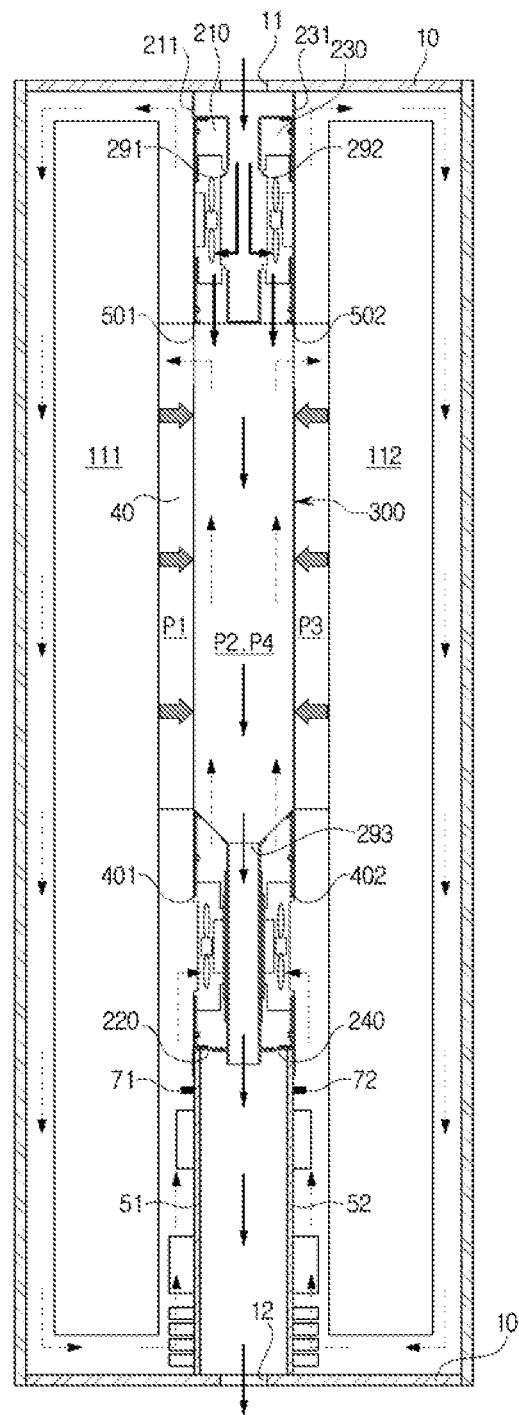
FIG. 5 is a cross-sectional view taken along line A-A' of FIG. 1.
Figure 6:
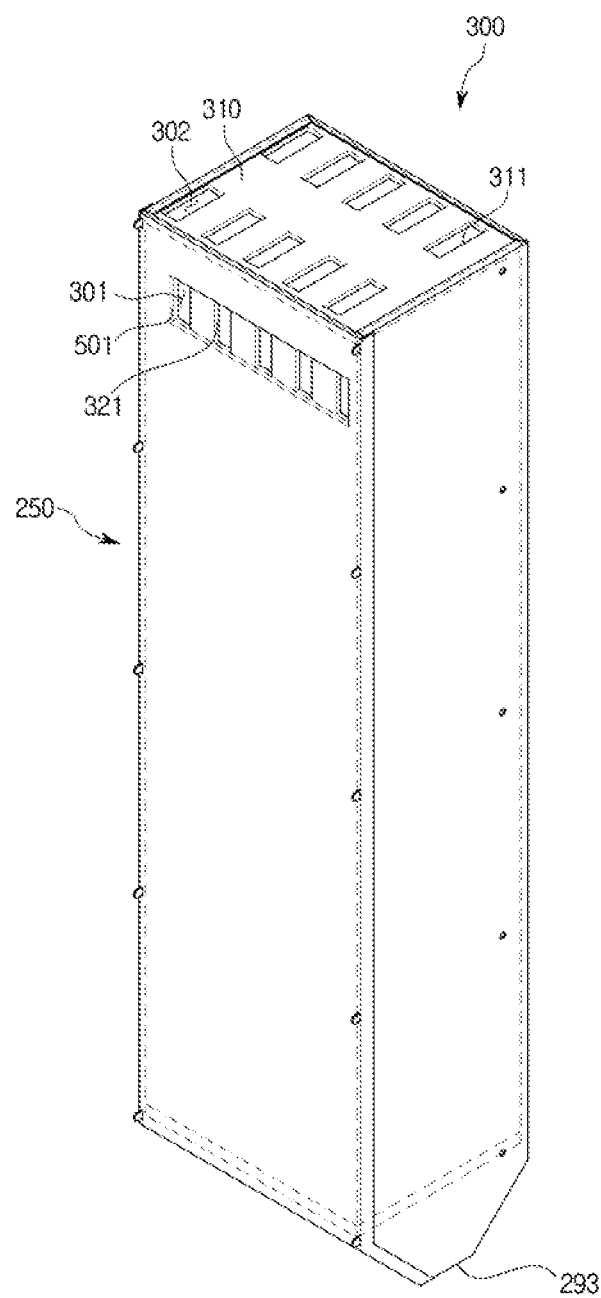
FIG. 6 is a view illustrating a heat exchanger shown in FIG. 4.

FIG. 1 is a perspective view illustrating a display apparatus according to an embodiment of the disclosure, FIG. 2 is an exploded perspective view illustrating a display apparatus according to an embodiment of the disclosure, FIG. 3 is a perspective view illustrating a heat exchange device according to an embodiment of the disclosure, FIG. 4 is an exploded perspective view illustrating a heat exchange device according to an embodiment of the disclosure, FIG. 5 is a cross-sectional view taken along line A-A' of FIG. 1, and FIG. 6 is a view illustrating a heat exchanger shown in FIG. 4.

Referring to FIGS. 1 to 6, a display apparatus 1 may include a housing 10 forming the external appearance thereof. The housing 10 is provided to be installed outdoors. The housing 10 may include a rectangular parallelepiped shape with a front side and a rear side open.

The housing 10 may include an inlet 11 and an outlet 12. The inlet 11 of the housing 10 may be formed on an upper surface of the housing 10, and the outlet 12 may be formed on a lower surface of the housing 10. The inlet 11 may include at least one hole formed through the upper surface of the housing 10 so that outside air may be introduced into the housing 10 therethrough. The outlet 12 may include at least one hole formed through the lower surface of the housing 10 so that outside air introduced into the housing 10 through the inlet 11 is discharged to the outside of the housing 10 therethrough. In the embodiment of the disclosure, the inlet 11 and the outlet 12 are illustrated as including at least one hole, but the aspect of the disclosure is not limited thereto. For example, the inlet and outlet may include at least one slit. In addition, the positions of the inlet and outlet are not limited to the above examples and may be variously changed.

The display apparatus 1 may further include a protective glass 20 disposed to protect the display module 110. The protective glass 20 may be installed on the front and rear surfaces of the housing 10, respectively. The protective glass 20 is formed of a transparent material while having rigidity, such as tempered glass and the like, and protect the display module 110 disposed at an inside of the protective glass 20 while allowing an image displayed on the display module 110 to be visible from the outside.

The protective glass 20 may include a first protective glass 21 provided on the front surface of the housing 10 and a second protective glass 22 provided on the rear surface of the housing 10. The protective glass 20 may have a size corresponding to a size of the display module 110. Specifically, the protective glass 20 may be disposed to correspond to a display area of a display panel (not shown) in which an image is displayed.

The display apparatus 1 may include a first display module 111 provided so that an image is displayed in a direction toward the front side (a first direction) of the housing 10 and a second display module 112 provided so that an image is displayed on the rear side (a second direction) of the housing 10. The display apparatus 1 according to embodiments of the disclosure is provided to display an image in both directions through the front and rear surfaces thereof.

The first display module 111 may display content. The content may include content received from outside, or content stored therein. The first display module 111 may be disposed inside the housing 10. The first display module 111 may be located behind the first protective glass 21. The first display module 111 may include a display panel on which an image is displayed and a backlight unit (not shown) coupled to a rear surface of the display panel to transmit light to the display panel.

The second display module 112 may be disposed inside the housing 10 and may be located behind the second protective glass 22. The second display module 112 may be disposed spaced apart from the first display module 111. Since the second display module 112 has the same configuration and function as those of the first display module 111, a detailed description thereof is omitted.

The display apparatus 1 may further include a heat exchange device 200. The heat exchange device 200 is disposed behind the first display module 111 and the second display module 112 to receive heat from at least one of the first display module 111 and the second display module 112 and perform heat exchange. The heat exchange device 200 may be coupled to receive heat from the first display module 111 and the second display module 112 in a heat conduction manner.

The heat exchange device 200 is disposed on the rear, of the first display module 111 and the second display module 112 so that the heat inside the housing 10 is dissipated at the rear side, of the first display module 111 and the second display module 112. In this case, heat inside the housing 10 may be generated from at least one of the first display module 111, the second display modules 112, and a controller 50. In addition, heat inside the housing 10 may be generated by sunlight incident onto the display apparatus 1.

Heat inside the housing 10 may be concentrated on the heat exchange device 200 by a heat conduction method.

The display apparatus 1 may further include a heat transfer member 40. The heat transfer member 40 may be disposed between the first display module 111, the second display modules 112, and the heat exchange device 200. The heat transfer member 40 may be disposed between the first display module 111 and the heat exchange device 200 to transfer heat received from the first display module 111 to the heat exchange device 200 in a heat conduction manner. The heat transfer member 40 may include at least one of a heat dissipation pad (a thermal pad) or a metal member. The heat transfer member 40 may be disposed between the second display module 112 and the heat exchange device 200 to transfer heat received from the second display module 112 to the heat exchange device 200 in a heat conduction manner. The heat transfer members 40 are disposed in close contact with the first display module 11, the second display modules 112, and the heat exchange device 200, and removes air that may prevent the heat transfer between the first display module 111, the second display module 112, and the heat exchange device 200, such that heat passing through the first and second display modules 111 and 112 is effectively transferred to the heat exchange device 200 (see FIG. 5).

The display apparatus 1 may further include the controller 50. The controller 50 may be provided inside the housing 10 to drive the first display module 111 and the second display module 112. The controller 50 may include a first controller SI provided to drive the first display module 111 and a second controller 52 provided to drive the second display module 112. In the following description, the first controller SI and the second controller 52 will be collectively referred to as the controller 50.

The controller 50 may include a memory (not shown) for storing data regarding an algorithm for controlling the operations of the components of the display apparatus 1 or a program that represents the algorithm, and a processor (not shown) that performs the operations using the data stored in the memory. In this case, the memory and the processor may be implemented as separate chips. Alternatively, the memory and the processor may be implemented as a single chip.

The controller 50 may be arranged to be positioned vertically in line with the heat exchange device 200 in an upper side and lower side direction of the display apparatus 1. As the controller 50 and the heat exchange device 200 are arranged in line with each other, the display apparatus 1 may be provided with a slim design. Although the controller according to the embodiment of the disclosure is illustrated as being disposed at a lower side of the heat exchanger, the aspect of the disclosure is not limited thereto. For example, the controller may be disposed at an upper side or lateral side of the heat exchange device.

The controller 50 may further include a circuit board and at least one electrical component 53 mounted on the circuit board. The electrical components 53 may include central processing unit, switching mode power supply SMPS, LD, etc. that may implement functions thereof while exchanging with each other.

Referring to FIGS. 3 to 5, the heat exchange device 200 includes a first heat exchange portion 201 provided to cool the first display module 111, a second heat exchange portion 201 provided to cool the second display module 112, and a heat exchanger 300 provided to be selectively shared by the first heat exchange portion 201 and the second heat exchange portion 202.

The first heat exchange portion 201 may include a first case 210, a second case 220, and the heat exchanger 300.

The first heat exchange portion 201 includes a first cooling passage P allowing air to be circulated to the first display module 111, and a second cooling passage P2 allowing outside air introduced through the inlet 11 of the housing 10 to cool the first display module 111 and then to be discharged through the outlet 12.

The first heat exchange portion 201 includes the first case 210, the second case 220, a first blower device 261 accommodated in the first case 210, and a second blower device 262 accommodated in the second case 220.

The first case 210 may include a first panel 211 and a first frame 212. The first panel 211 may be disposed to face the first display module 111. The first panel 211 may be disposed to face the first display module 111 to form the front appearance of the heat exchange device 200. The first frame 212 may be coupled to the rear side of the first panel 211. The first frame 212 may be formed with a first inlet hole 291 allowing outside air flowing into the housing 10 through the inlet 11 to be introduced into the heat exchange device 200. The first inlet hole 291 may be formed on a rear side of the first frame 212. The first frame 212 may be coupled to the first panel 211 to form a first accommodation portion 213 for accommodating the first blower device 261 therein. The first accommodation portion 213 is formed to be connected to the heat exchanger 300, which will be described below. The first blower device 261 may be coupled to the first panel 211.

The outside air introduced through the first inlet hole 291 of the first case 210 passes through the heat exchanger 300, during which the air is heat exchanged with heat transferred from the first display module 111 and discharged through the outlet 12.

The second case 220 may be disposed below the first case 210. The second case 220 may be arranged to be located vertically in line with the first case 210.

The second case 220 may include a second panel 221 and a second frame 222. The second panel 221 may be disposed to face the first display module 111. The second panel 221 is disposed to face the first display module 111 to form the front appearance of the heat exchange device 200. The second frame 222 may be coupled to the rear side of the second panel 221. The second frame 222 may be coupled to the second panel 221 to form a second accommodation portion 223 for accommodating the second blower device 262 therein. The second blower device 262 may be coupled to the second frame 222. The second accommodation portion 223 may be formed to be connected to the heat exchanger 300. The second case 220 may be provided with a first opening 401 for communicating the first cooling passage P1 with the heat exchanger 300 so that the air on the first cooling passage P1 is circulated to the heat exchanger 300 by the second blower device 262. The first opening 401 is formed in the second panel 221. The first opening 401 is formed so that air having heat exchanged with the first display module 111 is transferred to the heat exchanger 300.

The first case 210 and the second case 220 may be disposed with the heat exchanger 300 interposed therebetween such that the first case 210 is disposed above the second case 220.

The second heat exchange portion 202 may include a third case 230, a fourth case 240, and the heat exchanger 300.

The second heat exchange portion 202 includes a third cooling passage P3 allowing air to be circulated to the second display module 112, and a fourth cooling passage P4 allowing outside air introduced through the inlet 11 of the housing 10 to cool the second display module 112 and then to be discharged through the outlet 12.

The second heat exchange portion 202 includes the third case 230, the fourth case 240, a third blower device 263 accommodated in the third case 230, and a fourth blower device 264 accommodated in the fourth case 240.

The third case 210 may include a third panel 231 and a third frame 232. The third panel 231 may be disposed to face the second display module 112. The third panel 231 may be disposed to face the second display module 112 to form the front appearance of the heat exchange device 200. The third frame 232 may be coupled to the rear side of the third panel 211. The third frame 232 may be formed with a second inlet hole 292 allowing outside air flowing into the housing 10 through the inlet 1 to be introduced into the heat exchange device 200. The second inlet hole 292 may be formed on a rear side of the third frame 232. The third frame 232 may be coupled to the third panel 231 to form a third accommodation portion 233 for accommodating the third blower device 263 therein. The third accommodation portion 233 is formed to be connected to the heat exchanger 300, which will be described below. The third blower device 261 may be coupled to the third panel 231.

The outside air introduced through the second inlet hole 292 of the third case 230 passes through the heat exchanger 300, during which the air has heat exchanged with heat transferred from the second display module 112 and discharged through the outlet 12.

The fourth case 240 may be disposed below the third case 230. The fourth case 240 may be arranged to be located in line with the third case 230.

The fourth case 240 may include a fourth panel 241 and a fourth frame 242. The fourth panel 241 may be disposed to face the second display module 112. The fourth panel 241 is disposed to face the second display module 112 to form the rear side appearance of the heat exchange device 200. The fourth frame 242 may be coupled to the rear side of the fourth panel 241. The fourth frame 242 may be coupled to the fourth panel 241 to form a fourth accommodation portion 243 for accommodating the fourth blowing device 264 therein. The fourth accommodation portion 243 is formed to be connected to the heat exchanger 300. The fourth case 240 is provided with a second opening 402 for communicating the third cooling passage P3 with the heat exchanger 300 so that the air on the third cooling passage P3 is circulated to the heat exchanger 300 by the fourth blower device 264. The second opening 402 is formed in the fourth panel 241. The second opening 402 is formed so that air having heat exchanged with the second display module 112 is transferred to the heat exchanger 300.

The third case 230 and the fourth case 240 may be disposed with the heat exchanger 300 interposed therebetween such that the third case 230 is disposed above the fourth case 240.

The heat exchange device 200 may further include a first cover 200a and a second cover 200b coupled to both sides of the first heat exchange portion 201 and the second heat exchange portion 202 to form the external appearance thereof.

The heat exchange device 200 may be provided with at least one temperature sensor 71 and 72. The temperature sensors 71 and 72 include a first temperature sensor 71 that measures the temperature of the first display module 111 and a second temperature sensor 72 that measures the temperature of the second display module 112. Although the first temperature sensor 71 and the second temperature sensor 72 are illustrated as being provided in the controller 50, the aspect of the disclosure is not limited thereto. For example, the first temperature sensor may be provided to measure the temperature of the first cooling passage and the second cooling passage, and the second temperature sensor may be provided to measure the temperature of the third cooling passage and the fourth cooling passage.

Figure 7:
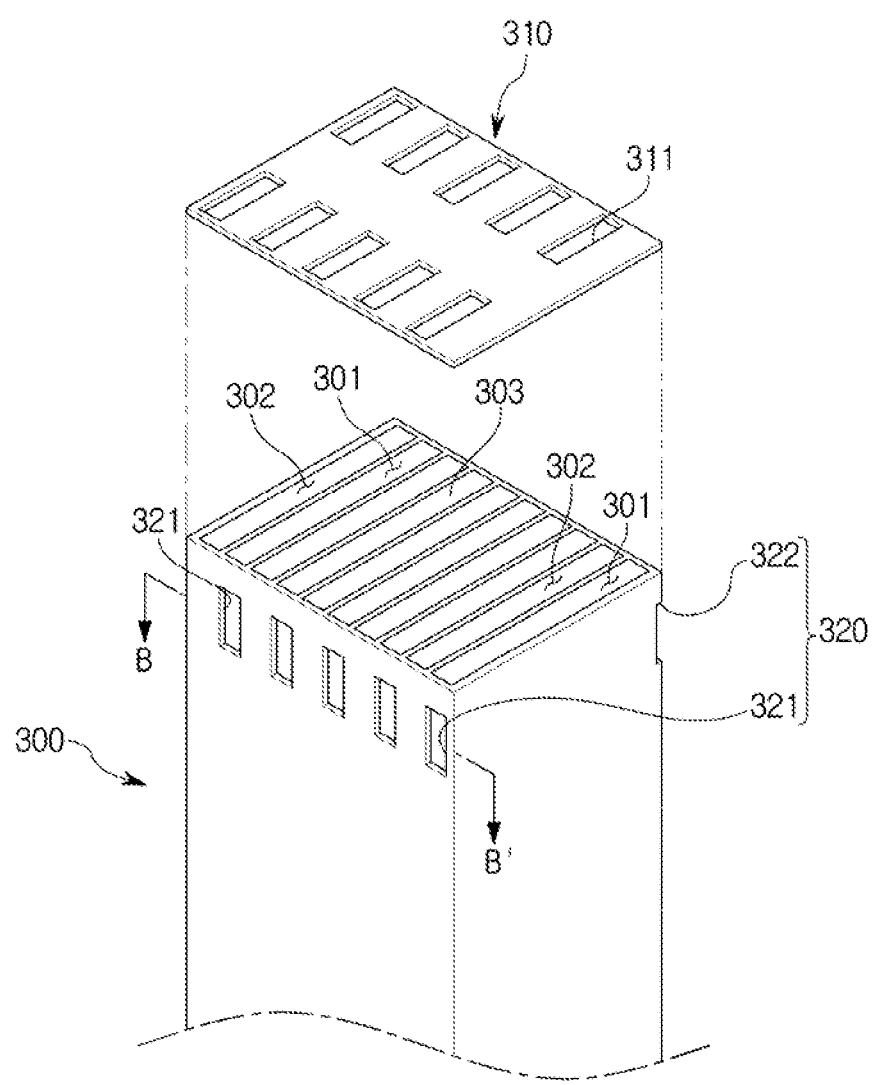
FIG. 7 is an exploded perspective view illustrating a part of a heat exchanger according to an embodiment of the disclosure.
Figure 8:
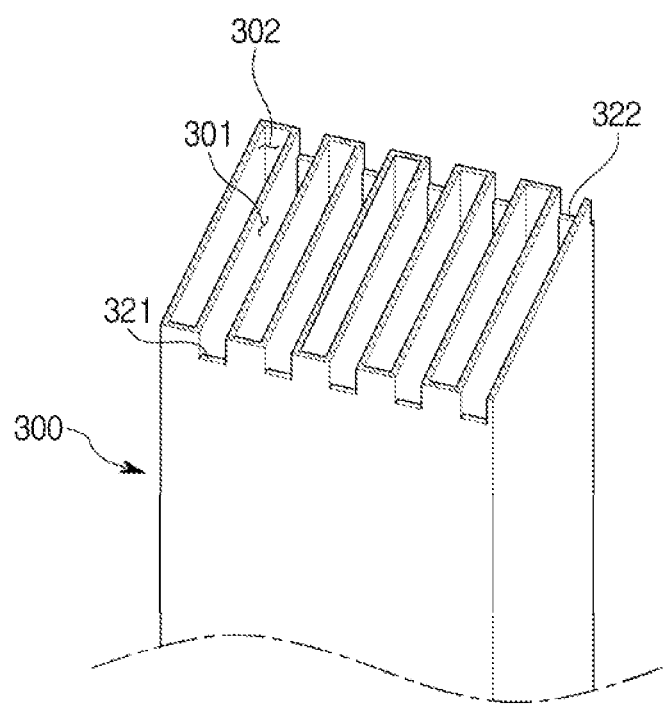
FIG. 8 is an enlarged view illustrating a part of a heat exchanger according to an embodiment of the disclosure.

FIG. 7 is an exploded perspective view illustrating a part of the heat exchanger according to an embodiment of the disclosure, and FIG. 8 is an enlarged view illustrating a part the heat exchanger according to an embodiment of the disclosure.

Referring to FIGS. 7 to 8, the heat exchange device 200 may further include the heat exchanger 300. The heat exchanger 300 may be accommodated in a fifth case 250. The fifth case 250 may include a fifth panel 251 and a fifth frame 252 coupled to the rear of the fifth panel 251, to accommodate the heat exchanger 300 therein.

The fifth case 250 is provided with an outlet hole 293 formed to discharge air flowing through the second cooling passage P2 and the fourth cooling passage P4. The outlet hole 293 may be formed at the bottom of the fifth case 250. The fifth case 250 includes a first through hole 501 connecting the first display module 111 to the heat exchanger 300 so that air in the first cooling passage P1 is heat-exchanged through the heat exchanger 300 and a second through hole 502 connecting the second display module 112 to the heat exchanger so that air in the third cooling passage P3 is heat-exchanged through the heat exchanger 300.

The first through hole 501 may be formed in the fifth panel 251 of the fifth case 250, and the second through hole 502 may be formed in the fifth frame 252.

The heat exchanger 300 may include at least one first channel 301 and at least one second channel 302 extending in an upper side and lower side direction H of the display apparatus 1.

The first channel 301 is provided to be shared by the first cooling passage P1 and the third cooling passage P3. The second channel 302 is provided to be shared by the second cooling passage P2 and the fourth cooling passage P4.

The first channel 301 and the second channel 302 may be alternately disposed with each other. The first channel 301 is provided to connect the first cooling passage P1 to the third cooling passage P3 through a connection hole 320. The first channel 301 includes a first connection hole 321 formed to be connected to the first cooling passage P1. The first channel 302 includes a second connection hole 322 formed to be connected to the third cooling passage P3. The first connection hole 321 and the second connection hole 322 may be formed at positions corresponding to each other. The first connection hole 321 and the second connection hole 322 allow the first cooling passage P1 and the second cooling passage P2 to be subject to heat-exchange through the first channel 301.

The heat exchanger 300 may further include a heat exchange fin 303 partitioning the plurality of channels. The heat exchange fin 303 may prevent the air moving along the first channel 301 and the air moving along the second channel 302 from being mixed with each other. The heat exchanger 300 may further include a guide panel 310. The guide panel 310 may be provided on the top of the heat exchanger 300. The guide panel 310 may be provided with a plurality of guide panel inlet holes 311. The guide panel inlet hole 311 may be formed to pass through at a position corresponding to that of the second channel 302. The guide panel inlet hole 311 may be disposed to correspond to the second channel 302. The guide panel inlet hole 311 is provided to allow the outside air introduced through the first inlet hole 291 and the second inlet hole 292 to be guided to the second cooling passage P2 and the fourth cooling passage P4, respectively. Outside air may be introduced into the second cooling passage P2 and the fourth cooling passage P4 through the guide panel inlet hole 311. The heat exchange device 200 may include the controller 50. When the temperature of the first display module 111 is higher than the temperature of the second display module 112, the controller 50 of the heat exchange device 200 may perform control to cause the speed of at least one of the first blower device 261 or the second blower device 262 to increase. Conversely, when the temperature of the first display module 111 is lower than the temperature of the second display module 112, the controller 50 of the heat exchange device 200 may perform control to cause the speed of at least one of the third blower device 263 or the fourth blower device 264 to increase.

The display apparatus 1 includes the first, second, third, and fourth cooling passages P1, P2, P3, and P4 formed inside the housing 10 to cool the heat transferred from the first display module 111 and the controller 50 and from the second display module 112 and the controller 50.

The first cooling passage P1 and the third cooling passage P3 may be isolated from each other while providing circulation through the second blower device 262 and the fourth blower device 264, respectively. The first cooling passage P1 provides circulation to cool the periphery of the first display module 111, and the third cooling passage P3 provides circulation to cool the periphery of the second display module 112.

In this case, the first cooling passage P1 provides circulation between the front of the first display module 111 and the first channel 301 of the heat exchanger 300 through the first opening 401 formed in the second case 220 and the first connection hole 501 formed in the fifth case 250. The third cooling passage P3 provides circulation through the front of the second display module 112 and the second channel 302 of the heat exchanger 300 through the second opening 402 formed in the third case 240 and the second connection hole 322 formed in the fifth case 250.

The second cooling passage P2 and the fourth cooling passage P4 respectively cause outside air introduced through the first inlet hole 291 and the second inlet hole 292 of the first case 210 and the third case 230 to be moved and then discharged to the outlet hole 293 of the fifth case 250.

In this case, the second cooling passage P2 is provided to allow air introduced through the first inlet hole 291 formed in the first case 210 to be heat-exchanged through the second channel 302 of the heat exchanger 300 and then discharged to the outlet hole 293 of the fifth case 250. The fourth cooling passage P4 is provided to allow air introduced through the second inlet hole 292 formed in the third case 230 to be heat-exchanged through the second channel 302 of the heat exchanger 300 and then discharged to the outlet hole 293 of the fifth case 250. Outside air may flow through the second cooling passage P2 and the fourth cooling passage P4.

The first cooling passage P1 may meet the second cooling passage P2 in the heat exchanger 300. The first cooling passage P1 may be interlocked with the second cooling passage P2. The air moving along the first cooling passage P1 and the air moving along the second cooling passage P2 have merely heat exchanged with each other in the heat exchanger 300 without being mixed with each other.

The third cooling passage P3 may meet the fourth cooling passage P4 in the heat exchanger 300. The third cooling passage P3 may be interlocked with the fourth cooling passage P4. The air moving along the third cooling passage P3 and the air moving along the fourth cooling passage P4 have merely heat exchanged with each other in the heat exchanger 300 without being mixed with each other.

The air moving along the first cooling passage P1 and the third cooling passage P3, which is relatively warm, may be subject to heat exchange with air moving along the second cooling passage P2 and the fourth cooling passage P4, which is relatively cold. Therefore, the first display module 111 and the second display module 112 may be prevented from being overheated, and the deterioration of the display panel may be prevented.

Outside air moves along the second cooling passage P2. The relatively cold air flows into the second channel 302 of the heat exchanger 300 through the first inlet hole 291 by the suction force of the first blower device 261. The outside air moving along the second channel 302 is subject to heat exchange with inside air moving along the first channel 301. In this case, the inside air may be cooled. The outside air having finished heat exchange with the inside air is discharged to the outside of the display apparatus 1 through the outlet hole 293 and the outlet 12.

Similarly, outside air moves along the fourth cooling passage P4. The relatively cold air flows into the second channel 302 of the heat exchanger 300 through the second inlet hole 292 by the suction force of the third blower device 263. The outside air moving along the second channel 302 is subject to heat exchange with inside air moving along the first channel 301. In this case, the inside air may be cooled. The outside air having finished heat exchange with the inside air is discharged to the outside of the display apparatus 1 through the outlet hole 293 and the outlet 12.

Inside air may move along the first cooling passage P1. The inside air may be heated by sunlight, the first display module 111, the controller 50, and the like. Therefore, the inside air may be relatively warm. The inside air is introduced into the first channel 301 of the heat exchanger 300 through the first opening 401 by the suction force of the second blower device 262. The inside air while moving along the first channel 301 is subject to heat exchange with the outside air moving along the second channel 302. The inside air cooled by the heat exchange with the outside air is discharged toward the first display module 111 through the first connection hole 501.

Similarly, inside air may move along the third cooling passage P3. The inside air may be heated by sunlight, the second display module 112, the controller 50, and the like. Therefore, the inside air may be relatively warm. The inside air is introduced into the first channel 301 of the heat exchanger 300 through the second opening 402 by the suction force of the fourth blower device 264. The inside air while moving along the first channel 301 is subject to heat exchange with outside air moving along the second channel 302. The inside air cooled by the heat exchange with the outside air is discharged toward the second display module 112 through the second opening 402.

In this case, when the temperature of the first display module 111 is higher or lower than the temperature of the second display module 112, the controller 50 may adjust the rotation speeds of the first to fourth blower devices 261, 262, 263, 264.

Accordingly, the control may be performed even when sunlight is incident onto one of the first display module 111 and the second display module 112 disposed opposite to each other and the temperature increase of the display apparatus occur, and thus a heat dissipation control suitable for a sunlight condition may be provided.

Figure 9:
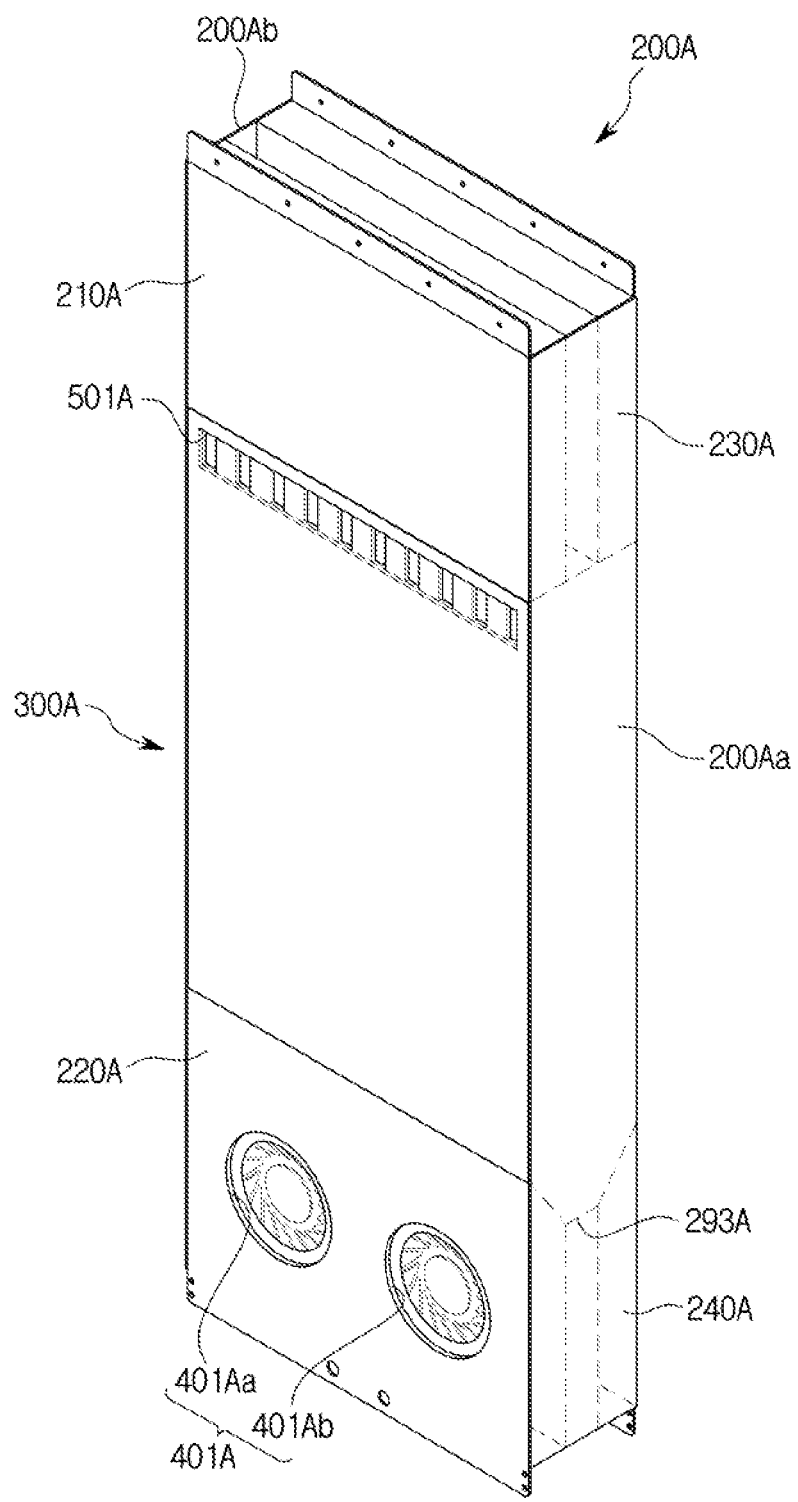
FIG. 9 is a perspective view illustrating a heat exchange device according to another embodiment of the disclosure.
Figure 10:
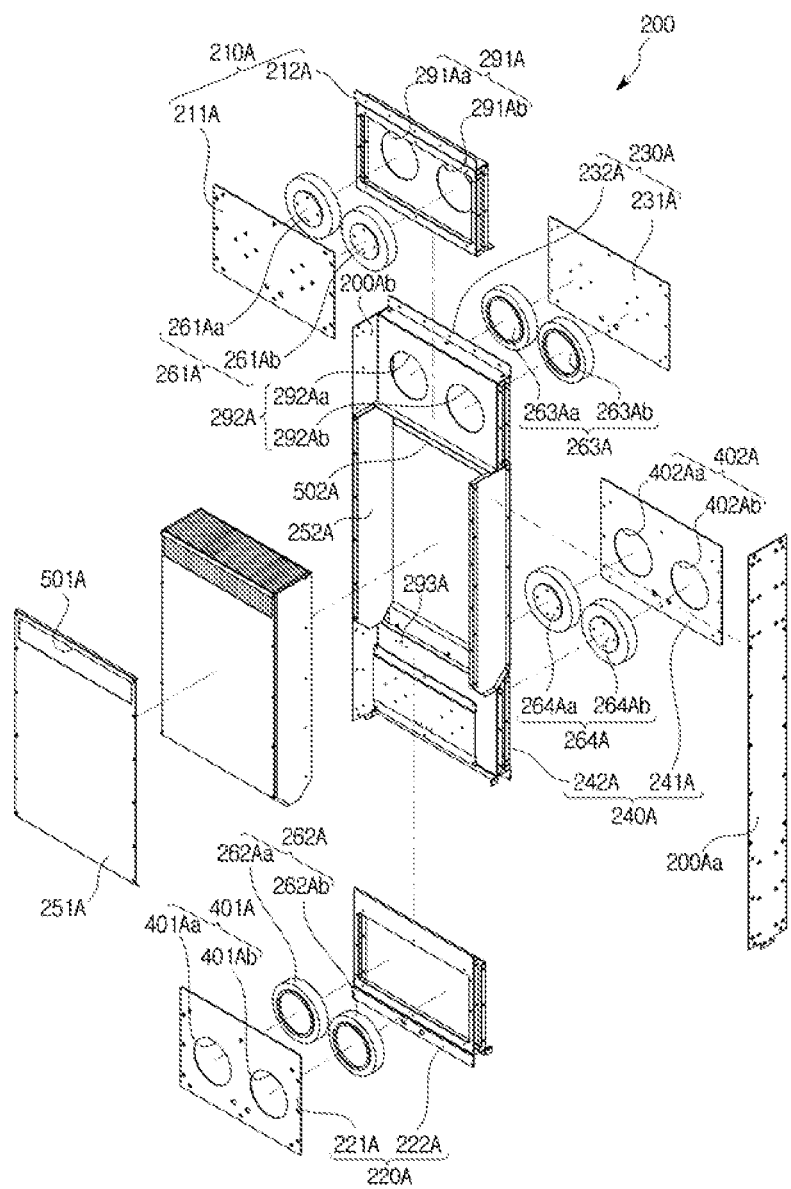
FIG. 10 is an exploded perspective view illustrating a heat exchange device according to another embodiment of the disclosure.

FIG. 9 is a perspective view illustrating a heat exchange device according to another embodiment of the disclosure, and FIG. 10 is an exploded perspective view illustrating a heat exchange device according to another embodiment of the disclosure. Reference numerals that are not shown in the drawing are referenced to FIGS. 1 and 8.

Referring to FIGS. 9 to 10, a heat exchange device 200A includes a first case 210A, a second case 220A, a third case 230A, a fourth case 240A, and a heat exchanger 300A.

The heat exchange device 200A includes a first cooling passage P1 allowing air to be circulated to the first display module 111 and a second cooling passage P2 allowing outside air introduced through the inlet 11 of the housing 10 to cool the first display module 111 and then to be discharged through the outlet 12.

The first case 210A may include a first panel 211A and a first frame 212A. The first panel 211A may be disposed to face the first display module 111 to form the front appearance of the heat exchange device 200A. The first frame 212A may be coupled to the rear side of the first panel 211A. The first frame 212A may be formed with a pair of first inlet holes 291Aa and 291Ab allowing outside air flowing into the housing 10 through the inlet 11 to be introduced into the heat exchange device 200A. The first inlet holes 291Aa and 291Ab may be formed through a rear surface of the first frame 212A. The first frame 212A may be coupled to the first panel 211A to form a first accommodation portion 213 for accommodating a pair of first blower devices 261Aa and 261Ab therein. The first accommodation portion 213 is formed to be connected to the heat exchanger 300A, which will be described below. The first blower devices 261Aa and 261Ab may be coupled to the first panel 211A.

The outside air introduced through the first inlet holes 291Aa and 291Ab of the first case 210A passes through the heat exchanger 300A, by which the outside air is subject to heat exchange with heat transferred from the first display module 111 and then discharged through the outlet 12.

The second case 220A may be disposed in line with the first case 210A.

The second case 220A may include a second panel 221A and a second frame 222A. The second frame 222A may be coupled to the rear side of the second panel 221A. The second frame 222A may be coupled to the second panel 221A to form a second accommodation portion 223 for accommodating a pair of second blower devices 262Aa and 262Ab therein. The second blower devices 262Aa and 262Ab may be coupled to the second frame 222A. The second accommodation portion 233 is formed to be connected to the heat exchanger 300A. The second case 220A may be provided with a pair of first openings 401Aa and 401Ab for communicating the first cooling passage P1 with the heat exchanger 300A so that the air on the first cooling passage P1 is circulated to the heat exchanger 300A by the second blower device 262A. The pair of first opening 401Aa and 401Ab is formed in the second panel 221A. The first openings 401Aa and 401Ab are formed so that air having heat exchanged with the first display module 111 is transferred to the heat exchanger 300.

The heat exchange device 200A includes a third cooling passage P3 allowing air to be circulated to the second display module 112 and a fourth cooling passage P4 allowing outside air introduced through the inlet 11 of the housing 10 to cool the second display module 112 and then to be discharged through the outlet 12.

The third case 230A may include a third panel 231A and a third frame 232A. The third panel 231A may be disposed to face the second display module 112 to form the rear appearance of the heat exchange device 200A. The third frame 232A may be coupled to the rear side of the third panel 231A. The third frame 232A may be formed with a pair of second inlet holes 292Aa and 292Ab allowing outside air flowing into the housing 10 through the inlet 11 to be introduced into the heat exchange device 200A. The second inlet holes 292Aa and 292Ab may be formed on a rear side of the third frame 232A. The third frame 232A may be coupled to the third panel 231A to form a third accommodation portion 233 for accommodating a pair of third blower devices 263Aa and 263Ab therein. The third accommodation portion 233 is formed to be connected to the heat exchanger 300A, which will be described below. The third blower devices 263Aa and 263Ab may be coupled to the third panel 231A.

The outside air introduced through the second inlet holes 292Aa and 292Ab of the third case 230A passes through the heat exchanger 300A, by which the outside air is subject to heat-exchange with heat transferred from the second display module 112 and then discharged through the outlet 12.

The fourth case 240A may be disposed to be in line with the third case 230A.

The fourth case 240A may include a fourth panel 241A and a fourth frame 242A. The fourth panel 241A is disposed to face the second display module 112 to form the rear appearance of the heat exchange device 200A. The fourth frame 242A may be coupled to the rear side of the fourth panel 241A. The fourth frame 242A may be coupled to the fourth panel 241A to form a fourth accommodation portion 243 for accommodating a pair of fourth blower devices 264Aa and 264Ab therein. The fourth accommodation portion 243 is formed to be connected to the heat exchanger 300A. The fourth case 240A may be provided with a pair of second openings 402Aa and 402Ab for communicating the third cooling passage P3 with the heat exchanger 300A so that the air on the third cooling passage P3 is circulated to the heat exchanger 300A by the fourth blower device 264. The pair of second openings 402Aa and 402Ab are formed in the fourth panel 241A. The second openings 402A are formed so that air having heat exchanged with the second display module 112 is transferred to the heat exchanger 300A.

The heat exchange device 200A may be provided with at least one temperature sensor 71 and 72. The temperature sensors 71 and 72 include a first temperature sensor 71 that measures the temperature of the first display module 111 and a second temperature sensor 72 that measures the temperature of the second display module 112.

The heat exchange device 200A may include a controller 50. When the temperature of the first display module 111 is higher than the temperature of the second display module 112, the controller 50 of the heat exchange device 200A may perform control to cause the speed of at least one side of the first blower devices 261Aa and 261Ab or the second blower devices 262Aa and 262Ab to increase. Conversely, when the temperature of the first display module 111 is lower than the temperature of the second display module 112, the controller 50 of the heat exchange device 200 may perform control to cause the speed at least one side of the third blower devices 263Aa and 263Ab or the fourth blower devices 264Aa and 264Ab to increase.

Since the specific configuration and the operation for cooling of the heat exchange device 200A are the same as in the above-described embodiment, description of components identical to those described above may be omitted.

Figure 11:
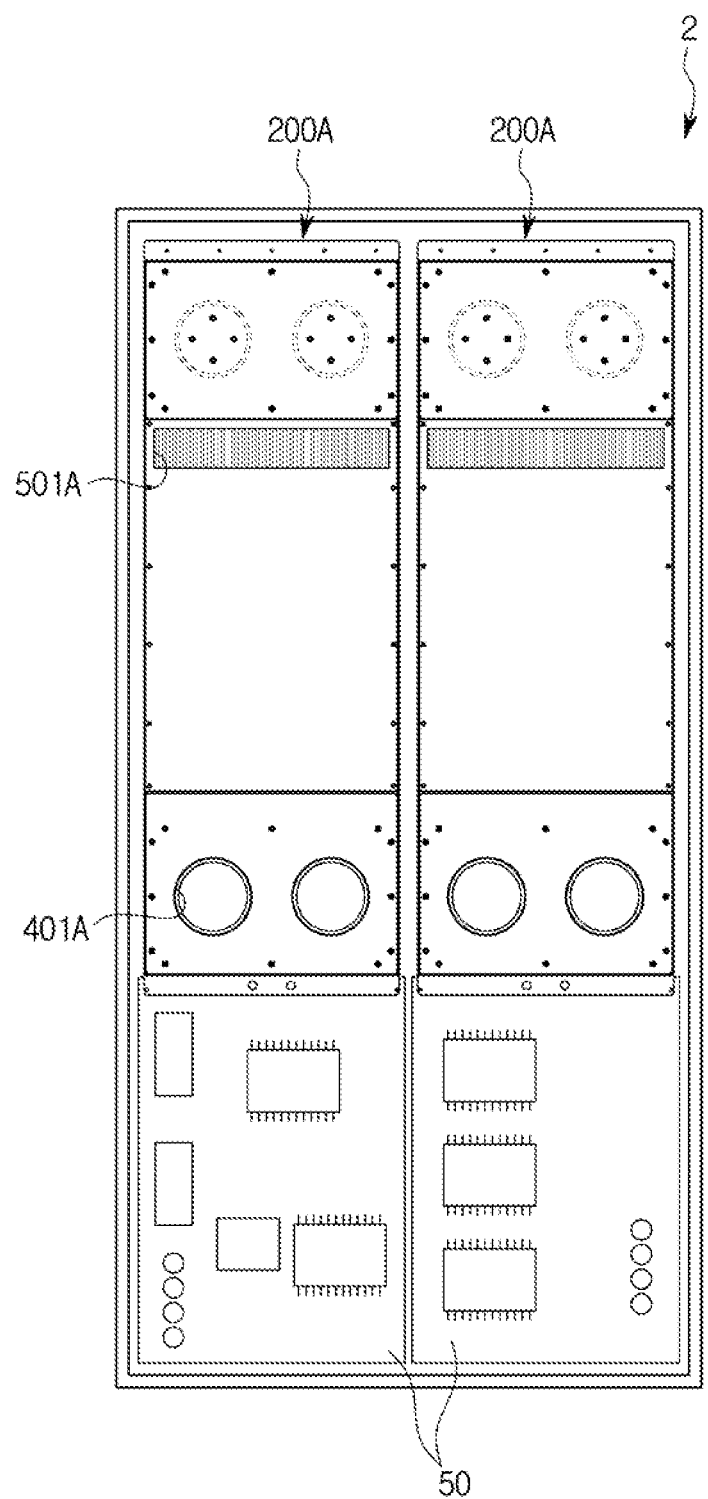
FIG. 11 is a view illustrating a display apparatus according to another embodiment of the disclosure.
Figure 12:
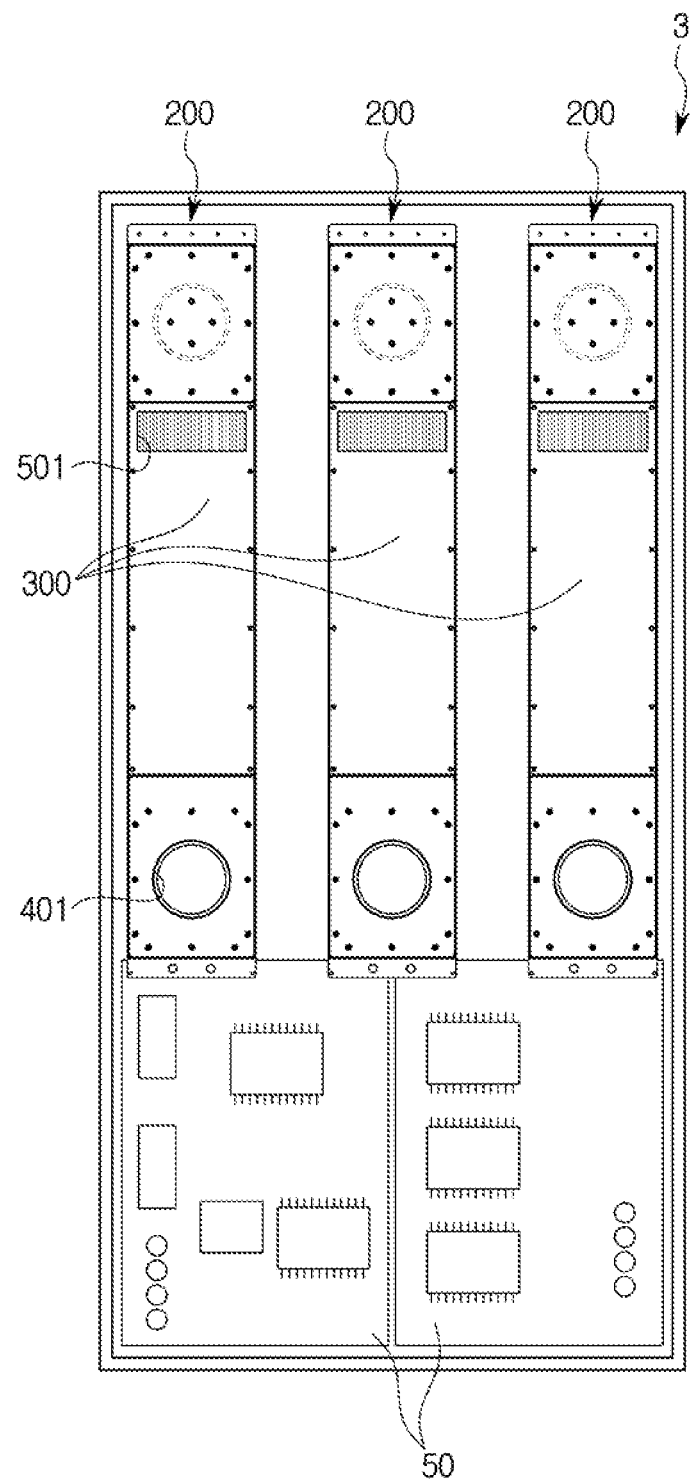
FIG. 12 is a view illustrating a display apparatus according to still another embodiment of the disclosure.

FIG. 11 is a view illustrating a display apparatus according to another embodiment of the disclosure, and FIG. 12 is a view illustrating a display apparatus according to still another embodiment of the disclosure. Reference numerals not shown in the drawing are referred to FIGS.

Referring to FIGS. 11 to 12, display apparatuses according to various embodiments of the disclosure will be described. A display apparatus 2 smaller than the display apparatus 1 shown in FIG. 1 may employ a total of two units of the heat exchange device 200A shown in FIG. 8.

In addition, a display apparatus 3 may employ a total of three units of the heat exchanger 200 according to the embodiment of the disclosure.

As described above, the heat exchanged devices 200 and 200A may be used in various ways to correspond to the size of the display apparatus 1, 2, or 3 according to the size of the display apparatus 1, 2, or 3.

Although few embodiments of the disclosure have been shown and described, the above embodiment is illustrative purpose only, and it would be appreciated by those skilled in the art that changes and modifications may be made in these embodiments without departing from the principles and scope of the disclosure, the scope of which is defined in the claims and their equivalents.

The invention claimed is:

1. A display apparatus comprising:
a first display module configured to display an image in a first direction;
a second display module configured to display an image in a second direction opposite to the first direction;
a housing configured to accommodate the first display module and the second display module, the housing having an inlet and an outlet;
a heat exchange device configured to receive heat from one of the first display module and the second display module and perform heat exchange, the heat exchange device comprising:
a first heat exchange portion having at least one cooling passage configured to cool the first display module;
a second heat exchange portion having at least one cooling passage configured to cool the second display module; and
a heat exchanger configured to be selectively shared by the first heat exchange portion and the second heat exchange portion,
wherein the at least one cooling passage of the first heat exchange portion includes: a first cooling passage configured to permit air to be circulated to the first display module; and a second cooling passage configured to permit outside air introduced through the inlet to cool the first display module and then to be discharged through the outlet,
wherein the at least one cooling passage of the second heat exchange portion includes: a third cooling passage configured to permit air to be circulated to the second display module; and
a fourth cooling passage configured to permit the outside air introduced through the inlet to cool the second display module and then to be discharged through the outlet, and
wherein the heat exchanger includes: a plurality of first channels configured to be shared by the first cooling passage and the third cooling passage; and a plurality of second channels configured to be shared by the second cooling passage and the fourth cooling passage.

2. The display apparatus of claim 1, wherein the first heat exchange portion includes: a first blower device configured to cause air of the second cooling passage to move, and suction the outside air;

a first case configured to accommodate the first blower device and having a first inlet hole;
a second blower device configured to cause air in the first cooling passage to move; and
a second case configured to accommodate the second blower device.

3. The display apparatus of claim 2, wherein the second heat exchange portion includes: a third blower device configured to cause air of the fourth cooling passage to move, and suction the outside air;
a third case configured to accommodate the third blower device and having a second inlet hole;
a fourth blower device configured to cause air in the third cooling passage to move; and
a fourth case configured to accommodate the fourth blower device.

4. The display apparatus of claim 3, further comprising a fifth case configured to accommodate the heat exchanger, wherein the fifth case includes an outlet hole through which air moving along the second cooling passage and the fourth cooling passage is configured to discharge.

5. The display apparatus of claim 4, wherein the fifth case includes:
a first connection hole configured to communicate the first cooling passage with the heat exchange such that the air of the first cooling passage is heat exchanged through the plurality of first channels; and
a second connection hole configured to communicate the third cooling passage with the heat exchange such that the air of the third cooling passage is heat exchanged through the plurality of first channels.

6. The display apparatus of claim 4, wherein the second case includes a first opening configured to communicate the first cooling passage with the heat exchanger such that the air of the first cooling passage is introduced into the plurality of first channels by the second blower device, and
the fourth case includes a second opening configured to communicate the third cooling passage with the heat exchanger such that the air of the third cooling passage is introduced into the plurality of first channels by the fourth blower device.

7. The display apparatus of claim 4, wherein the heat exchange device comprises a controller, and the controller performs control to cause a rotating speed of at least one of the first blower device or the second blower device to increase when the first display module has a temperature higher than a temperature of the second display module, and perform control to cause a rotating speed of at least one of the third blower device or the fourth blower device to increase when the first display module has a temperature lower than the temperature of the second display module.

8. The display apparatus of claim 7, wherein the heat exchange device includes at least one temperature sensor, and the at least one temperature sensor is disposed on at least one of the first display module or the second display module.

9. The display apparatus of claim 4, wherein the first case and the third case are provided at an upper side of the fifth case, and the second case and the fourth case are provided at a lower side of the fifth case.

10. The display apparatus of claim 1, wherein the plurality of first channels and the plurality of second channels are disposed in an alternate manner.

* * * * *